US006808802B2

(12) United States Patent
Lynn

(10) Patent No.: US 6,808,802 B2
(45) Date of Patent: Oct. 26, 2004

(54) EQUIPMENT COATING

(75) Inventor: David Mark Lynn, Eagle, ID (US)

(73) Assignee: NxEdge, Inc., Boise, ID (US)

( * ) Notice: Subject to any disclaimer, the term of this patent is extended or adjusted under 35 U.S.C. 154(b) by 0 days.

(21) Appl. No.: 10/199,842

(22) Filed: Jul. 18, 2002

(65) Prior Publication Data

US 2003/0150558 A1 Aug. 14, 2003

Related U.S. Application Data

(60) Provisional application No. 60/357,025, filed on Feb. 13, 2002.

(51) Int. Cl.[7] ......................... B32B 27/00; B32B 27/20; H01L 21/304

(52) U.S. Cl. ....................... 428/332; 428/421; 428/422; 156/345.12

(58) Field of Search ....................... 156/345.11–345.19; 428/421, 422, 332

(56) References Cited

U.S. PATENT DOCUMENTS

| | | | | | |
|---|---|---|---|---|---|
| 4,105,716 A | * | 8/1978 | Sakai et al. | 525/276 |
| 4,152,829 A | | 5/1979 | Domok et al. | |
| 4,395,445 A | | 7/1983 | Gebauer et al. | |
| 5,499,597 A | * | 3/1996 | Kronberg | 116/216 |
| 5,738,754 A | | 4/1998 | Hill et al. | |
| 6,090,475 A | | 7/2000 | Robinson et al. | 428/212 |
| 6,121,143 A | * | 9/2000 | Messner et al. | 438/692 |
| 6,267,644 B1 | * | 7/2001 | Molnar | 451/41 |
| 6,551,693 B1 | * | 4/2003 | Buffard et al. | 428/195 |
| 2003/0041967 A1 | * | 3/2003 | Marquardt et al. | 156/345.12 |

FOREIGN PATENT DOCUMENTS

GB 1485523 A * 9/1977
WO WO 00/22395 * 4/2000

OTHER PUBLICATIONS

Encyclopedia of Polymer Science and Engineering, vol. 1: Additives, pp. 472–475, Aug. –1989.*

Lenk, "When a paint isn't good enough," Plastic Coats Protect the World, 1981, Dec. 1981.*

Jones, "Recent Advances in Thin Film Flurocarbon Coatings Applications," Corrosion 84, Apr. 2–6, 1984, pp. 66–1 through 66–3, Paper No. 66, New Orleans, Louisiana.*

Norman, "Developments in fluropolymer coatings as corrosion resistant liners for chemical plant," Special Report, Finishing, pp. 26–29, Sep. 1995.*

Strobech, "Fluropolymer Coating of Production Equipment," Surface Coatings International, pp. 34–39, 1996, Kvistgard, Denmark, Jan. –1996.*

Fujita et al., "Development of CMP (Chemical–Mechanical Polishing) Technology," The Smitomo Search, Sep. 1997, pp. 82–91, No. 59.*

* cited by examiner

*Primary Examiner*—Ramsey Zacharia
(74) *Attorney, Agent, or Firm*—Black Lowe & Graham

(57) ABSTRACT

This invention comprises a coating for equipment parts, particularly including chemical mechanical polishing equipment parts and other equipment that may experience wear or contaminant build-up. The coating includes a fluoropolymer based material that may also contain a colorant or pigment to visually contrast with particles or slurry that is deposited on the parts during use. In some embodiments, multiple layers are applied in contrasting colors so that when a layer closer to the surface begins to wear a lower layer will be readily visible, signaling that re-coating or replacement will soon be required.

13 Claims, 4 Drawing Sheets

EQUIPMENT COATING

PRIORITY CLAIM

This application claims the benefit of provisional application Ser. No. 60/357,025, filed Feb. 13, 2002.

FIELD OF THE INVENTION

This invention relates generally to non-stick, durable performance coatings for use on equipment components, particularly including coatings for use in the semiconductor industry.

BACKGROUND OF THE INVENTION

The semiconductor industry uses equipment known as Chemical Mechanical Polishing (CMP) equipment in the manufacture of wafers. CMP equipment flattens the silicon or other wafer surface to within 50-nanometer precision or better. CMP flattens the wafer by removing material from the uneven wafer surface until a flat, or "planarized" surface is created. By flattening the surface, photolithography can take place with greater accuracy, enabling film layers to be built up with minimal height variations. CMP is both a chemical and mechanical process, combining an acidic or basic fluid solution with an abrasive polishing material. The CMP system usually has a polishing head that presses the rotating wafer against a flexible pad. A wet chemical slurry containing a micro-abrasive is placed between the wafer and pad.

CMP is especially critical to fabricating copper-based semiconductors, where it is used to define the copper wiring structures. This advanced smoothing capability enables chipmakers to continue shrinking circuits and extends the performance of lithographic tools. Accordingly, CMP is an important part of the semiconductor chip-making process.

Unfortunately, the chemicals used in this smoothing process attack and degrade the CMP equipment and all related components. As a result, the CMP equipment wears out rapidly and must be replaced or refurbished frequently. In addition, the coating on the tooling degrades and sheds particulates, introducing foreign matter and hindering the process of smoothing the wafers.

The industry presently relies exclusively on anodized aluminum and standard powder coating to protect the CMP equipment and to reduce particle contamination. While anodized aluminum is better than uncoated metals or certain other materials, it still suffers from degradation and particle contamination Accordingly, there is a need to provide better protection for tooling against the damaging effects from the slurry used in the industry. Aside from the CMP uses, there is a general need for improved coatings for equipment parts that are used in an environment of wear or foreign matter build-up.

SUMMARY OF THE INVENTION

The present invention provides a wear indicating coating for a variety of tools or other components, particularly including Chemical Mechanical Polishing equipment having a working surface configured to planarize a semiconductor material surface. The wear indicating coating includes a fluoropolymer based primer coating adjacent the working surface. Adjacent the primer coating is a fluoropolymer based coating. The coating may contain a pigment or colorant to visually contrast the coating from the particulates or foreign matter that may be deposited on the CMP equipment. Thus, the pigment allows CMP equipment users to see equipment wear and particle build-up as indicated by slurry build-up at early stages.

The present invention further includes a unique method of forming a mechanical and chemical resistant coating upon a substrate, which, in the case of CMP parts, is typically a metallic substrate. The method starts by masking the areas of the substrate that are not to be coated. Subsequently, the surface to be coated is prepared by roughing the surface to improve the surface's bonding characteristics. The next step is preheating the substrate to a predetermined temperature followed by applying a primer coating. After applying the primer coating to the substrate, another heating step occurs followed by applying at least one intermediate coating over the primer coating and then again heating the part. Finally, the method includes applying an optional top coating to the at least one intermediate coating with its appropriate process.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
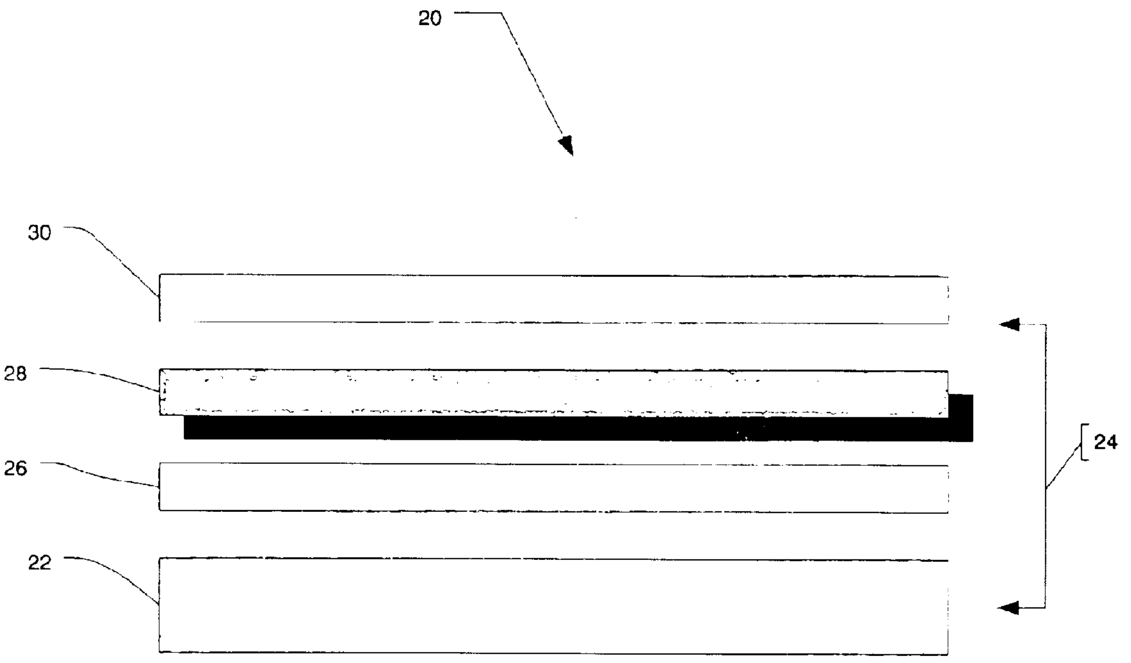
FIG. 1 is an exploded side view of a coated CMP part according to the instant invention.

The present invention provides a system and method for applying a protective coating on various components, including parts of CMP equipment. By way of overview and with reference to FIG. 1, one presently preferred embodiment of the invention includes a coated part 20 adaptable to CMP equipment, including a part surface or substrate 22 that is covered by a laminate coating 24. The laminate coating 24 includes a base primer coating 26 used to facilitate an adequate bond between the substrate 22 and subsequent coatings; at least one intermediate colored coating 28; and, a top coating 30. Together, the coating 24 protects the substrate 22 from mechanical and chemical harm. Specific details of the coated part 20 are described in more detail below.

As used in this specification, the term "substrate" means the surface of any part, equipment component, or other object that can be coated. Likewise, the term "laminate" coating refers to the preferred coating embodiment having several layers as well as a coating comprising a single layer. Similarly, while the preferred embodiment includes a primer, intermediate layer, and top coat, the term "intermediate" layer also refers to a part coating comprised of a single layer, without a top coat or primer.

The coating used in the present invention includes a non-stick coating applied to the surface of the CMP tooling. Preferably, the non-stick coating is a fluoropolymer such as PFA, FEP, ETFE, ECTFE, or other type of fluoropolymer. In an actual embodiment, the coating is an ECTFE fluoropolymer commercially available under the trademark Halar® and sold by Ausimont USA, Inc., 10 Leonards Lane Thorofare, N.J. 08086, USA. Fluoropolymers are also available from Dupont, under the brand names Tefzel® and Teflon®, or other sources.

Generally one coat, preferably the intermediate coat 28, of the laminate coating 24 is blended with a colorant or other additive to give it a distinctive color that provides contrast with the slurry, abrasive matter, or other particles expected to build up on the equipment. Accordingly, it is possible to readily see when the coated part 20 accumulates a build-up of foreign particles.

In the preferred embodiment, the colorant is a blue pigment available from Ferro Corporation, 1000 Lakeside Avenue, Cleveland, Ohio 44114-7000. In an actual embodiment, the colorant is Ferro's product code F.6279. Other colorants and additives or different colors are also possible, consistent with this invention. Preferably, the fluoropolymer is blended with the pigment at a ratio of 50 grams of pigment to 5 pounds of fluoropolymer.

In an alternate embodiment, multiple layers of the coating contain different colored pigments. Thus, for example, a layer close to the substrate (such as the primer layer or an intermediate layer) can be colored gray, while an adjacent layer is colored blue. When the blue layer begins to wear, the gray layer will become visible, signaling that it is time to replace or recoat the part. Any number of colors and layers may be used to accomplish the wear-indicating result, although the two colors preferably contrast with one another so that when the top layer begins to wear the lower layer is readily visible. For example, contrasting layers of black and white or blue and gray may be used. The same contrasting effect may also be possible by using a primer and an intermediate coating with naturally-contrasting colors, so that adding pigments are unnecessary. Depending on the application and the materials chosen, a sufficient contrast may be achieved. In this regard, "clear" is considered to be a color that may be desirable for a coating layer. For example, a clear base coat applied to a metallic surface will give the appearance of a metallic-colored layer. In the preferred embodiment, however, pigments are added to improve upon the contrast and to provide a final color that contrasts with contaminants expected to be deposited on the equipment.

Figure 2:
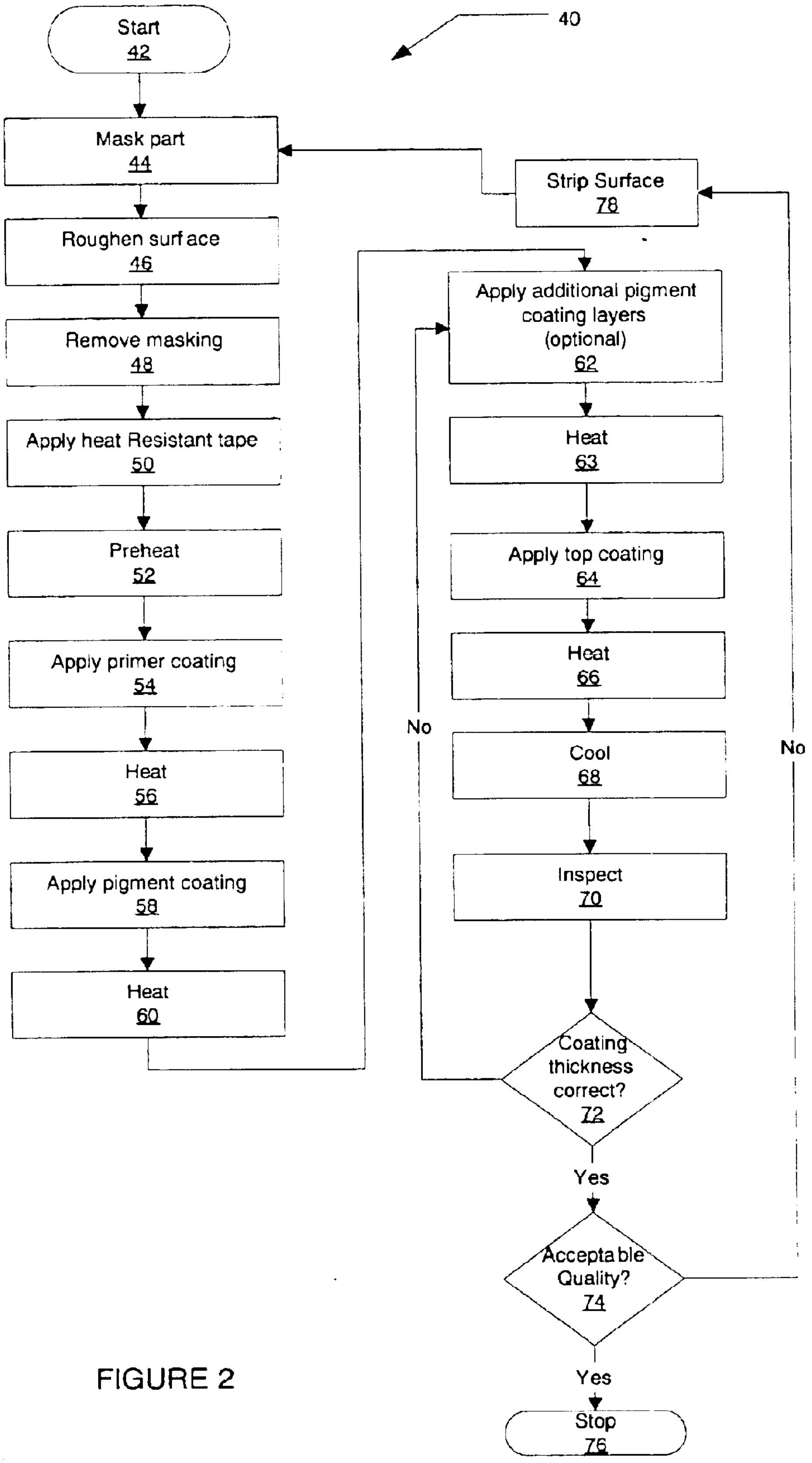
FIG. 2 is a schematic of the coating process of the preferred embodiment of this invention.

FIG. 2 illustrates a preferred embodiment of the coating process 40 beginning at block 42. The parts to be coated, for example, substrate 22, are first masked at block 44 to cover any surface areas intended not to be coated. Then, as indicated by block 46, the parts are blasted with 80-grit aluminum oxide to rough up the surface to improve adhesion of the coating. While a grit-blast with 80-grit aluminum oxide is preferred, the surface may be roughed up in other manners, or using a different materials other than 80-grit aluminum oxide.

Once the surface is prepared by roughing up surfaces to be coated, the masking is removed at block 48 and replaced with a heat-resistant tape, block 50. In this case, the heat-resistant tape masks the same areas that are intended not to be coated, but does so with a tape or other material that can withstand high temperatures. The masked article is then pre-baked at 560° F. for about 15 minutes to remove impurities, improve the bonding ability, and prevent outgassing under the coating, at block 52.

Next, as indicated by block 54, the article is coated with a chemical resistant fluorpolymer primer at a thickness of about 0.005 inches or 5 mils. While a variety of materials would be suitable as a primer, in an actual embodiment it is Ausimont fluoropolymer 6814, chosen because it has exceptional bonding and acid resistance qualities. After covering the component part with primer, at block 56 the article is put into the oven, which is still at 560° F., and immediately turned down to 500 deg F. It is left in for about 5 minutes.

Once the primer coat is flowed out, a first coat of the coating mixed with pigment is applied to a thickness of 3 mils, block 58, and baked at 500° F. for 15 minutes, at a block 60. Additional coats of the colored fluoropolymer are added at block 62, and heated at block 63 in the same manner as with block 60, to achieve a preferred thickness of 11 mils. While this is the preferred thickness for a CMP application, the coating may be applied to produce a greater or lesser thickness, consistent with this invention. Likewise, the final thickness of 11 mils is preferably achieved by applying a total of four coats of fluoropolymer material. This thickness may alternatively be produced by a greater or lesser number of coatings, depending on the thickness of the coats applied.

A top coating 30 of fluoropolymer is applied at a block 64. The top coating 30 is preferably a clear fluoropolymer, having no added pigment. Alternatively, there need be no additional top coating or the top coating can include a colorant. The top coating is preferably a thin coat, less than 3 mils. Once applied, the article is baked at 490° F. for about 10–15 minutes at block 66.

While the temperatures and baking times described above have been found to be suitable for applying a colored fluoropolymer such as ECTFE, both the temperature and baking times may be varied, consistent with this invention.

The part is allowed to cool to room temperature, at block 68. Once it is cool, it is unmasked and inspected at block 70 to determine whether the desired thickness, smoothness, and any other desired attributes have been achieved. An R.A. test is then performed. The preferred end product is specified at 15–25 mils thick, with R.A. less than 16. Some parts may have either a higher or lower thickness requirement, depending upon the final environment and the end use to which the user subjects the part. A determination is made regarding the acceptability of the laminate coating thickness at block 72. If it is not thick enough, the process returns to block 62 to add further coating layers, as desired.

If the thickness is acceptable, the process proceeds to block 74 to evaluate overall quality. If it is unacceptable, it is possible to either reheat and reflow the product, to add further coatings (returning to blocks 60 or 62) or to strip the coating at block 78 and start again. Upon meeting the established criteria for uniform and complete coverage, showing no delaminations or release of coating, no pinholes, and the part has uniform color, thickness and surface texture, the part is then passed through quality control testing, the part thus accepted, and the process finished, block 76.

The resulting application produces a nonstick surface that is chemical-resistant and abrasion-resistant. When used with a pigment, the pigment allows users to see the CMP slurry when it is starting to build up at the earliest stages, providing a forewarning that slurry is starting to build up and parts may have to be removed, cleaned, re-coated, or replaced. Because the coating is non-stick, the slurry can be usually be wiped clean and will only need to be recoated or replaced after an extended period of use.

Although the process has been described above with reference to CMP parts in particular, it is also valuable for other tools, equipment parts, and other components. In such applications, the addition of pigments allows operators to see the buildup of oil, debris, or other contaminants that can then be easily cleaned from the non-stick surface.

Figure 3:
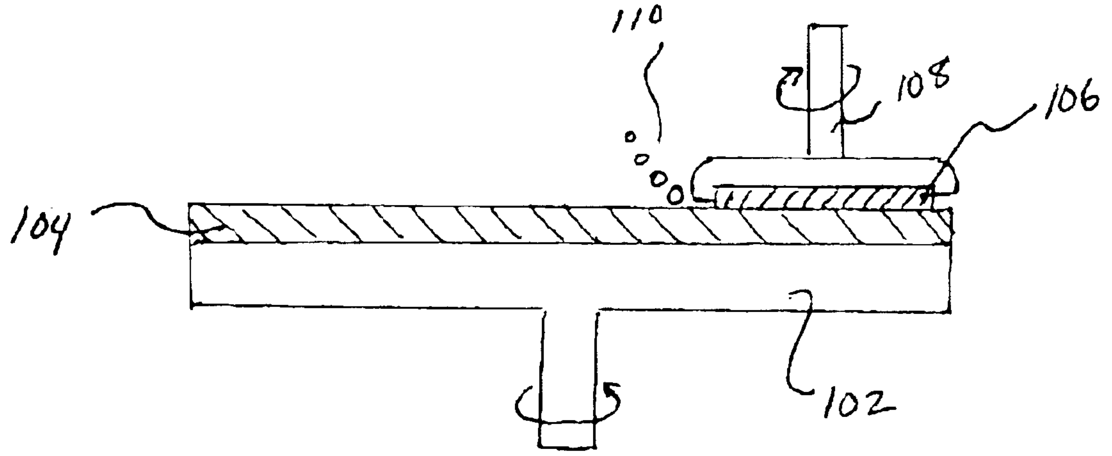
FIG. 3 is a representative illustration of CMP equipment having a coated CMP part in operation.

FIG. 3 shows a generic CMP system in operation, including a rotating base 102 having a top-mounted polishing pad 104. A wafer 106 is mounted to a rotating polishing head 108 to polish the wafer by abrasion. Slurry particles 110 used in the polishing process and worn away from the wafer 106 are sprayed from the working surface. As discussed above, some of the slurry 110 will splatter and deposit onto the rotating polishing head 108 or other components. For that reason, the polishing head 108 is coated as discussed above, preferably in a color that contrasts with the color of the slurry 110 or other materials that may build-up on the equipment. The inside of the polishing head 108 to which the wafer 106 is mounted need not be coated, and is preferably masked and not coated during the coating process. Because the polishing head is coated, it allows the slurry to be wiped away, avoiding any significant build-up. Likewise, the abrasive nature of the slurry will eventually cause the coating to wear away (though it will take longer than with other coatings). By using color contrasting layers, it will be easy to readily see when the coating is beginning to wear away, indicating at an early stage when the part must be re-coated or replaced.

Figure 4:
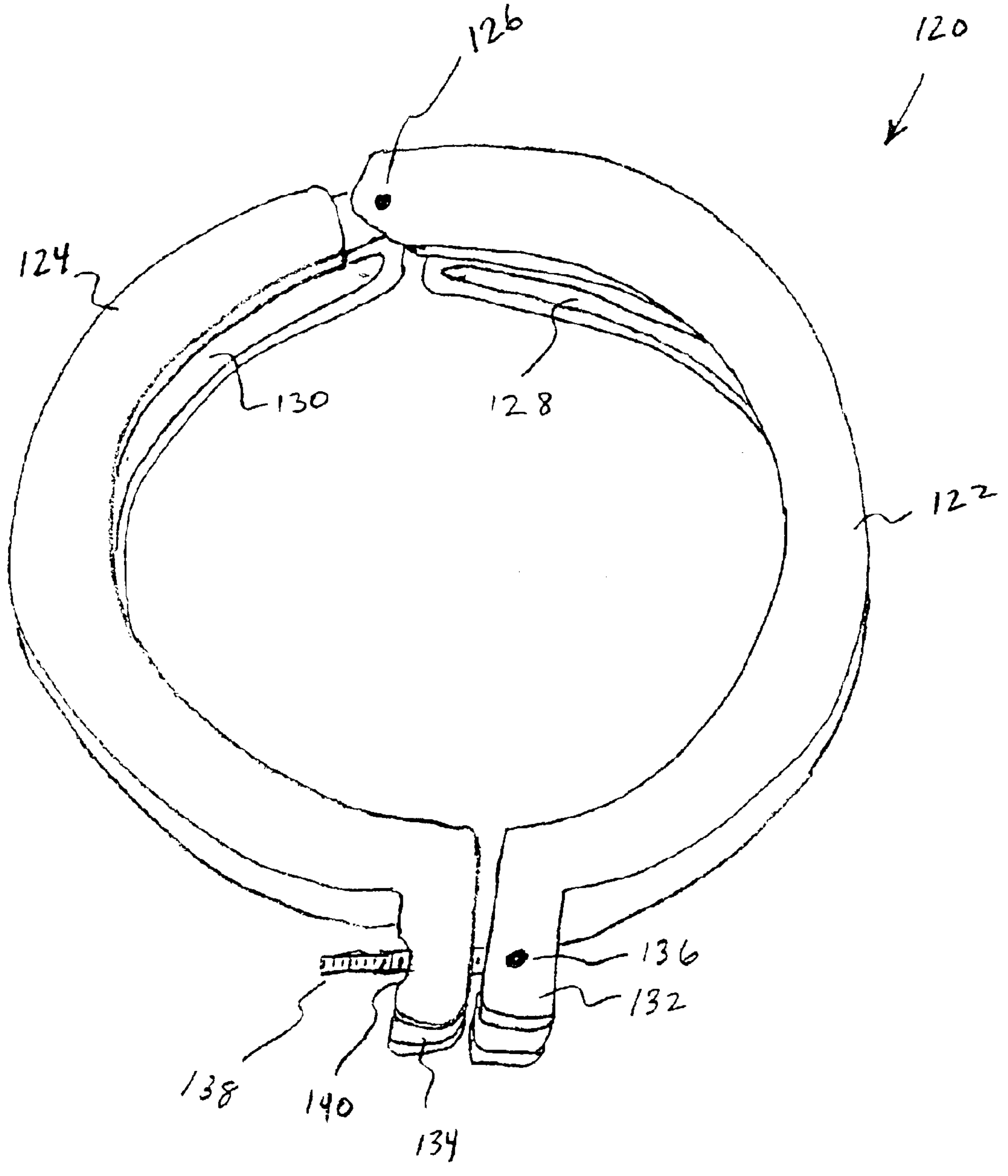
FIG. 4 is a representative illustration of a coated CMP part.

Another example of a coated CMP part is a clamp as illustrated in FIG. 4. The clamp 120 may be used, for example, to hold a silicon wafer for polishing. The clamp 120 includes a right semi-circular retainer 122 and a mating left semi-circular retainer 124 joined by a pin 126. The pin 126, which may be a rivet, bolt, or other connector, forms a pivot point allowing the two retainers 122, 124 to open and close about a wafer. Each retainer includes an internal channel 128, 130 to receive the wafer.

At an end of the retainers opposite the pin 126, each retainer 122, 124 includes a descending prong 132, 134. The right prong 132 descends perpendicularly from the right retainer 122, and includes upper and lower tabs that form the prong. Likewise, the left prong 134 includes upper and lower tabs to form the left prong 134. Another pin 136 extends through the right prong 132 to pivotally retain a bolt 138. The bolt is allowed to freely pivot downward to allow the clamp to open, or upward to lock the clamp in a closed position. A hemispherical washer (not shown) slides over the bolt 138, followed by an internally threaded nut (not shown). The hemispherical washer mates with a concave section 140 within the left prong 134 so that the clamp is held firmly closed when the nut is tightened on the bolt 138. The left retainer 124 and right retainer 122 are each coated with the coating of the preferred embodiment, as described above, so that they are covered with a blue-pigmented fluoropolymer coating. Accordingly, slurry or other materials deposited onto the clamp are easily wiped away.

While the coating invention has been described primarily in association with a CMP process, aspects of the invention are equally applicable to other environments. For example, parts used in aircraft or automotive industries that are in abrasive or high wear environments can be coated as described above. Depending on the amount of wear encountered by the particular component, a thicker or thinner layer of coating may be applied. By using multiple color-contrasting layers, users can quickly see when a part is beginning to wear and must be replaced. Likewise, the non-stick aspect allows oil, grease, tar, dirt, or other contaminants to be wiped clean before they build-up and damage the system.

While the preferred embodiment of the invention has been illustrated and described, as noted above, many changes can be made without departing from the spirit and scope of the invention. Accordingly, the scope of the invention should be limited only by the claims that follow.

I claim:

1. A coated chemical mechanical polishing equipment component, comprising:

a rotating polishing head; and a non-abrasive, non-stick coating applied to at least a portion of a surface of the component, the coating comprising a fluoropolymer based material.

2. The coated chemical mechanical polishing equipment component of claim 1, wherein the coating is adhered to the surface of the equipment component by depositing a layer of the coating onto the surface of the component and baking the component.

3. The component of claim 1, wherein the coating further comprises:

a first layer containing a fluoropolymer based material, the first layer including a first pigment having a first color, and a second layer containing a fluoropolymer based material having a second color, the second layer being closer to the surface of the part relative to the first layer, and further wherein the first color contrasts with the second color.

4. The component of claim 3, wherein the second color is only visible upon substantial wear of at least a portion of the first layer.

5. The component of claim 3, wherein the second layer further comprises a second pigment.

6. The component of claim 3, wherein the coating further comprises a top coat adjacent the first layer.

7. The component of claim 6, wherein the top coat is clear.

8. The component of claim 7, wherein the preferred total thickness of the coating is between about 015 and 025 mils.

9. The coated part of claim 1, wherein the coating further comprises a pigment.

10. The coated part of claim 9, wherein the pigment is blue.

11. The component of claim 1, wherein the coating comprises a primer layer adjacent the component, an intermediate layer adjacent the primer layer, and a top layer adjacent the intermediate layer.

12. The component of claim 11, wherein one or more of the primer, intermediate, or top layers contains a pigment.

13. The component of claim 1, wherein the fluoropolymer is at least one of a PFA, FEP, ETFE or ECTFE.

* * * * *